United States Patent
Kamasz et al.

(10) Patent No.: US 7,046,283 B1
(45) Date of Patent: May 16, 2006

(54) ARRANGEMENTS OF CLOCK LINE DRIVERS

(75) Inventors: Stacy R. Kamasz, Waterloo (CA); Martin J. Kiik, Waterloo (CA)

(73) Assignee: DALSA, Inc., Ontario (CA)

( * ) Notice: Subject to any disclaimer, the term of this patent is extended or adjusted under 35 U.S.C. 154(b) by 812 days.

(21) Appl. No.: 09/971,042

(22) Filed: Oct. 5, 2001

Related U.S. Application Data

(60) Provisional application No. 60/239,107, filed on Oct. 11, 2000.

(51) Int. Cl.
  *H04N 3/14* (2006.01)
  *H04N 5/335* (2006.01)
  *H01L 29/76* (2006.01)
  *H01L 27/148* (2006.01)
  *H01L 29/768* (2006.01)

(52) U.S. Cl. ............... 348/295; 348/312; 348/322; 348/324; 257/401; 257/235

(58) Field of Classification Search ........ 348/294–295, 348/302–324; 250/208.1, 238; 257/249–251, 257/401, 235, 291
See application file for complete search history.

(56) References Cited

U.S. PATENT DOCUMENTS

| | | | |
|---|---|---|---|
| 4,314,275 A | 2/1982 | Chapman | 358/113 |
| 4,344,001 A | 8/1982 | Tsuchiya et al. | 307/221 D |
| 4,375,652 A | 3/1983 | White | 358/213 |
| 4,439,788 A | 3/1984 | Frame | 358/213 |
| 4,761,565 A | 8/1988 | Kannegundla | 307/243 |
| 4,774,719 A | 9/1988 | Pelgrom et al. | 377/60 |
| 4,866,299 A | 9/1989 | Kannegundla | 307/270 |
| 4,965,471 A | 10/1990 | Gaboury | 307/446 |
| 5,047,660 A | 9/1991 | Kannegundla et al. | 307/270 |
| 5,155,597 A | 10/1992 | Lareau et al. | 358/213.24 |
| 5,237,422 A | 8/1993 | Kannegundla et al. | 358/213.11 |
| 5,668,593 A | 9/1997 | Lareau et al. | 348/146 |
| 5,798,786 A | 8/1998 | Lareau et al. | 348/144 |
| 5,923,370 A * | 7/1999 | Miethig et al. | 348/320 |
| 5,929,471 A * | 7/1999 | Weale et al. | 257/236 |
| 5,937,025 A * | 8/1999 | Smith | 377/63 |
| 5,981,933 A * | 11/1999 | Chamberlain et al. | 250/208.1 |
| 5,990,503 A * | 11/1999 | Ingram et al. | 257/236 |
| 6,054,703 A | 4/2000 | Liu | 250/208.1 |
| 6,108,032 A | 8/2000 | Hoagland | 348/144 |
| 6,459,077 B1 * | 10/2002 | Hynecek | 250/208.1 |
| 6,633,058 B1 * | 10/2003 | O. et al. | 257/232 |
| 6,770,860 B1 * | 8/2004 | O | 250/208.1 |
| 6,897,898 B1 * | 5/2005 | Shinohara | 348/294 |
| 6,906,749 B1 * | 6/2005 | Fox | 348/295 |
| 6,933,975 B1 * | 8/2005 | Wen | 348/312 |
| 2002/0033894 A1 * | 3/2002 | Watanabe et al. | 348/312 |

* cited by examiner

*Primary Examiner*—Ngoc-Yen Vu
*Assistant Examiner*—Kelly Jerabek
(74) *Attorney, Agent, or Firm*—Millen, White, Zelano & Branigan, P.C.

(57) ABSTRACT

A circuit includes a circuit chip and a plurality of clock drivers external to the circuit chip. The circuit chip includes a plurality of isolated clocking subunits and a corresponding plurality of terminals. Each clocking subunit is electrically isolated from any other clocking subunit. Each clocking subunit is coupled to a respective terminal. For each of the plurality of terminals, an output from one and only one clock driver of the plurality of clock drivers is coupled to the corresponding terminal of the plurality of terminals, and inputs of all clock drivers are coupled together.

29 Claims, 7 Drawing Sheets

ARRANGEMENTS OF CLOCK LINE DRIVERS

The priority of the Oct. 11, 2000 filing date of U.S. Provisional Application Ser. No. 60/239,107 is hereby claimed.

BACKGROUND OF THE INVENTION

1. Field of the Invention

The present invention relates to clock line drivers for integrated circuits. In particular, the invention relates to parallel arrangements of drivers to drive high capacitance clock lines.

2. Description of Related Art

The capacitance associated with a CCD clock line may be too large to be driven by a single off-chip clock driver. Consequently, multiple off-chip clock-drivers are required to be connected (off-chip or on-chip) to the single CCD clock line. The connection of multiple clock-drivers to a single CCD clock line creates performance and reliability issues. One clock driver momentarily in a high state may source current from its output into the output of an adjacent clock driver, whose outputs are tied together, and where the second clock driver's output is momentarily in a low-state. This causes a driver cross-over current rather than charging the intended CCD clock line. The driver cross-over current occurs when there is a low-impedance path between a high output of one clock driver and a low output of another clock driver that has been tied together. Such an occurrence starves the clock line from early current needed to provide fast rise/fall time and can lead to electrical damage of the clock drivers.

In a known TDI sensor, the CCD electrodes of a single clock phase of the TDI imaging region were grouped into two halves. In a first half, electrodes comprising a first portion of the particular phase were electrically connected together by a metal bus with two bond pads connected to the metal bus. Similarly, in a second half, electrodes comprising a second portion of the particular clock phase were connected together by their own metal bus with two bond pads connected to the metal bus. The two bond pads of the first half and their connected bus were electrically independent from the two bond pads of the second half and their connected bus. In this TDI sensor, the electrodes of the first half were clocked by one pair of clock drivers and the electrodes of the second half were clocked by another pair of clock drivers. In this approach, the capacitances of the first and second halves were reduced relative to the capacitance of the entire imaging area. However, in this arrangement, driver cross-over currents could still occur if differences in propagation delay through the clock drivers of a clock driver pair result in a time skew in the driver clock signals since there was a low-impedance path between a high output of one clock driver and a low output of another clock driver that had been tied together in either the first or second half of the imaging areas. This arrangement was duplicated for each clock phase.

U.S. Pat. No. 6,108,032 to Hoagland describes a plurality of photo-sensitive cells arranged in rows and columns. These pixel rows are further arranged into a number of row segments, where each row segment corresponds to a separate clocking section. Each row segment is clocked in parallel; however, the row segments are clocked at different clocking frequencies to compensate for image motion of objects contained in the scene. Hoagland varies the clocking rates applied to the different row segments to compensate for relative motion differences within the image. However, in column 15, lines 4–7, Hoagland describes that a camera control unit 406 can command that the clocking of all row segments be done at the same rate (uniform IMC) when objects contained in the scene will have the same relative forward motion. Nevertheless, Hoagland does not connect together the inputs of clock drivers as is done in the present invention. Unlike the present invention, Hoagland is not concerned with and does not address the present problem of providing enough current to drive a CCD with a high RC constant at high speeds, and does not disclose a plurality of external clock drivers.

U.S. Pat. No. 5,155,597 to Lareau, et al., describes an imaging array with motion compensation where charge transfer rates of several column groups are varied according to a rate of motion to affect motion compensation.

SUMMARY OF INVENTION

An object of the invention is to overcome limitations in the prior art. It is another object of the invention to provide a high speed clocking structure for a circuit.

These and other objects of the invention are achieved in a circuit that comprises a circuit chip and a plurality of clock drivers external to the circuit chip. The circuit chip includes a plurality of isolated clocking subunits and a corresponding plurality of terminals. Each clocking subunit is electrically isolated from any other clocking subunit and is coupled to a respective terminal. Each clock driver includes a respective input and output. The inputs of all clock drivers are coupled together and the output of each clock driver is coupled to a respective terminal.

DETAILED DESCRIPTION OF PREFERRED EMBODIMENTS

The present invention includes a circuit that drives and distributes clock signals throughout a sensor. For each clock phase, the circuit includes plural clock drivers connected together at their inputs and having respective outputs individually connected to corresponding bond pads in the sensor. For each clock phase, there is a corresponding clock line in the sensor itself. Each clock line is divided into plural clocking subunits with a single bond pad connected to each subunit and an output from a single clock driver connected to a respective bond pad. The plural subunits present an approximately equal capacitance to the clock drivers coupled to the corresponding subunits.

The rise and fall times of such clock signals are governed, at least in part, by the RC (resistance-capacitance) time constant of the circuit. The capacitance is largely a function of the sensor chip (layout architecture, materials, design rules, etc), and the resistance is a function of both the output resistance of the clock driver and the distributed resistance of the clock lines on the sensor chip (particularly when the clock signals are distributed over doped poly crystalline silicon lines, or simply poly lines). By breaking up a single clock line into plural subunits, it is possible to reduce the RC time constant of the load on a clock driver. The present invention partitions the RC load of each clock line into smaller loads driven by individual clock drivers. In this way, faster rise and fall times may be achieved without the problem of current cross-over between clock drivers. Such circuits enable the sensor to operate at high speed without being limited by the current drive capability of a single off-chip clock driver.

Figure 1:
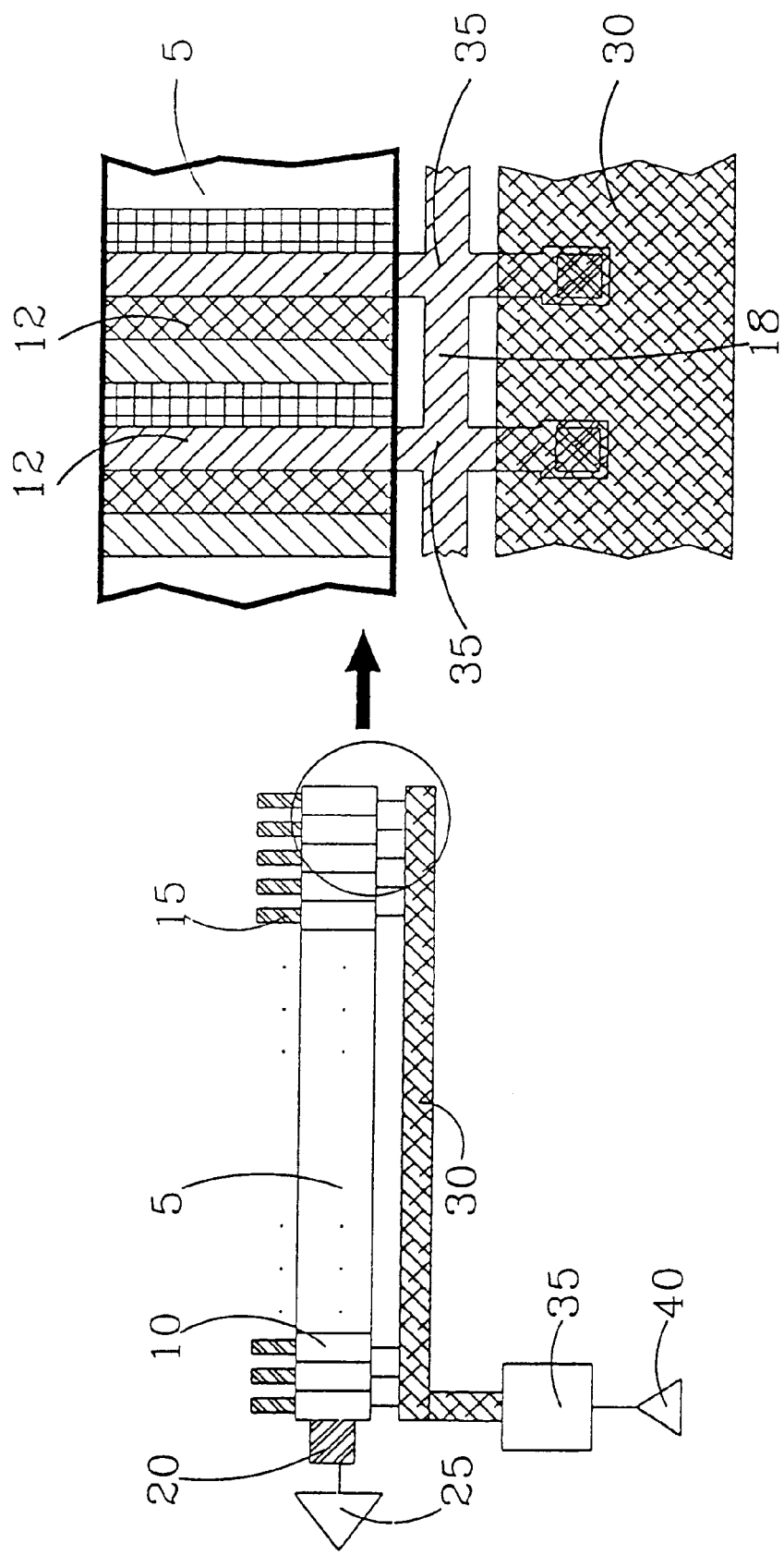
FIG. 1 is a schematic diagram of a conventional linescan CCD.

In FIG. 1, a known line scan CCD sensor includes horizontal CCD 5. Horizontal CCD 5 includes plural CCD stages 10 that receive charge from pixels 15 and then clock the charge to output structure 20 and buffer 25. Horizontal CCD 5 includes a channel overlaid by plural poly electrodes 12. Each CCD stage 10 includes a small grouping of polysilicon electrodes 12 that are clocked dissimilarly (e.g., 2 clock lines for 2 phase, 3 clock lines for 3 phase and 4 clock lines for 4 phase). Each phase is electrically independent.

In FIG. 1, like clock phase electrodes from each CCD stage 10 of horizontal CCD 5 are connected to poly clock bus line 35. Metal bus line 30 connects periodically to poly clock bus line 35 to lessen the resistance of the clock line distributing the clock signal. Metal bus line 30 runs adjacent to the horizontal CCD and connects to poly clock bus line 35.

In FIG. 1, poly clock bus line 35 connects electrodes 12 of like clock phase to each other by poly connections 18 and also to the low resistance metal bus 30. The bus line 30 connects to bond pad 35 where off-chip clock driver 40 clocks the CCD by periodically charging and discharging the capacitance associated with the CCD phase. Here, one such metal bus line 30 is shown for simplicity; however, in general, each CCD phase will have its own bus line.

Figure 2:
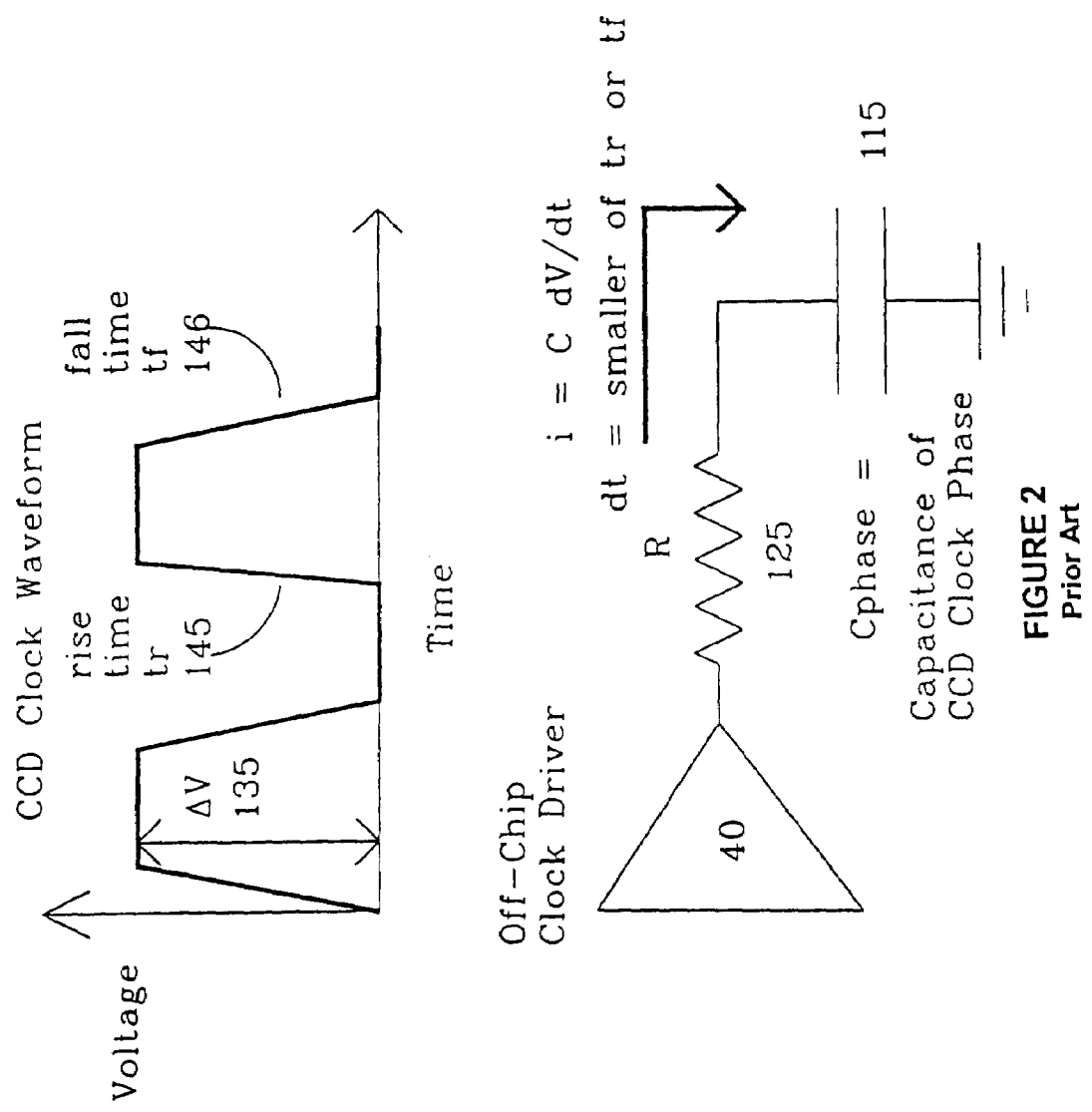
FIG. 2 is a timing diagram of the clocking of a CCD Phase.

As shown in FIG. 2, each CCD phase can be treated as capacitance 115, whose value is the lumped sum of each capacitance associated with each polysilicon electrode 12 associated with the phase. In operation, the off-chip clock driver 40 periodically charges and discharges capacitance 115 associated with the CCD phase. Signal currents to charge and discharge capacitance 115 pass through resistance 125 which may include the output resistance of the clock driver, and/or the resistance from the driver, through the bond pad, to the CCD electrode. Usually these resistances are made small by design and manufacture so as to not create inordinate RC time constant delays in clock waveform.

The peak current provided by the off-chip clock driver is given by i=C multiplied by dV/dt where C=CCD clock phase capacitance 115, dV=ΔV (i.e., the difference 135 between the high potential and the low potential of the clock waveform), and dt=Δt is the shortest transition time (rise time 145 or fall time 146). If the capacitance 115 is large and/or if the clock signal for the phase must be clocked rapidly (i.e., dt is small), the peak current that the clock driver must provide will be large. For example, the capacitance associated with a particular uniquely-clocked phase of a TDI CCD can be in the tens of nF, and the clock driver can require peak current of many amperes for transitions in the order of several ns. This can easily exceed the current drive capacity of a single clock driver.

Figure 3:
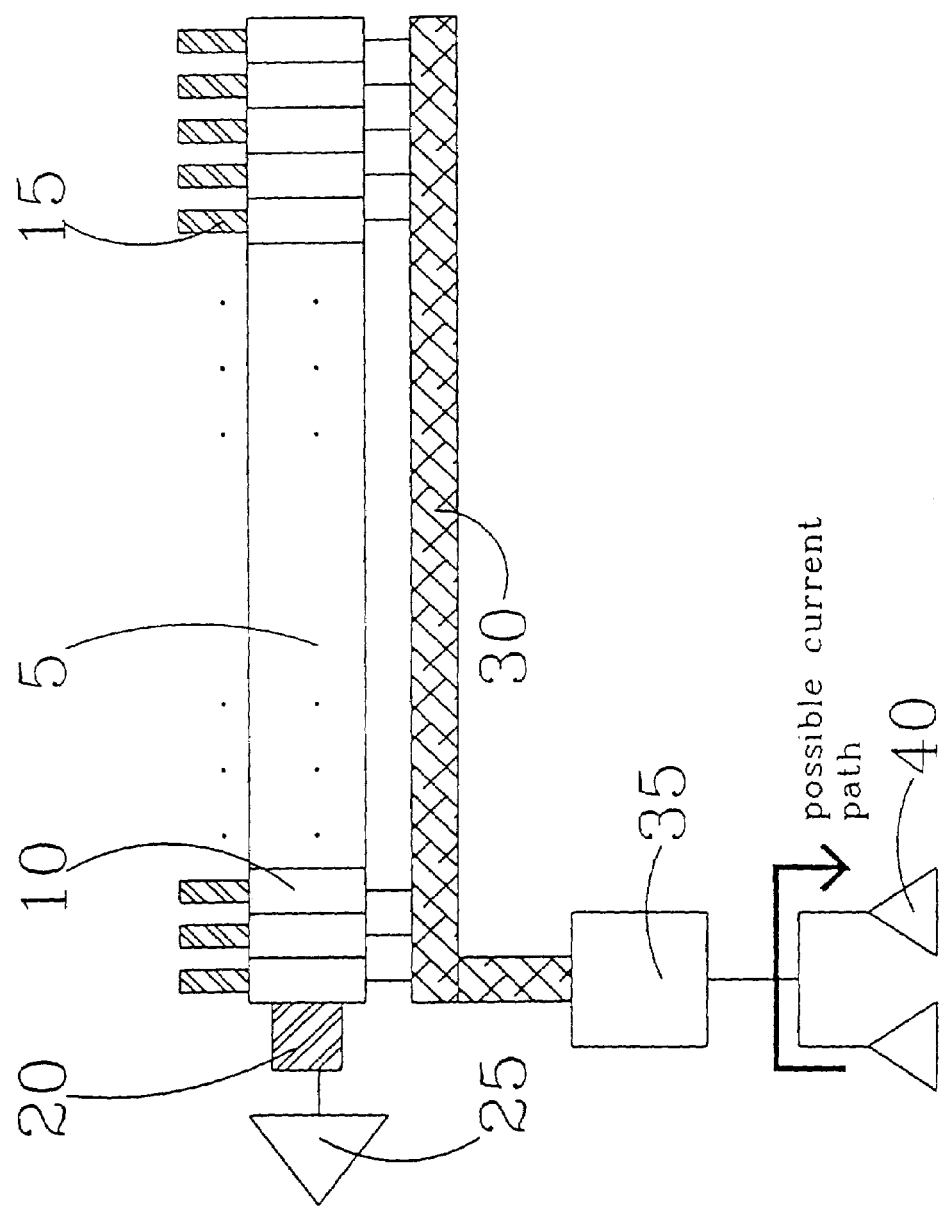
FIGS. 3 and 4 are schematic diagrams of known high speed clocking structures for operation of CCD when the current-drive of a single clock driver beneath that required by the CCD.
Figure 4:
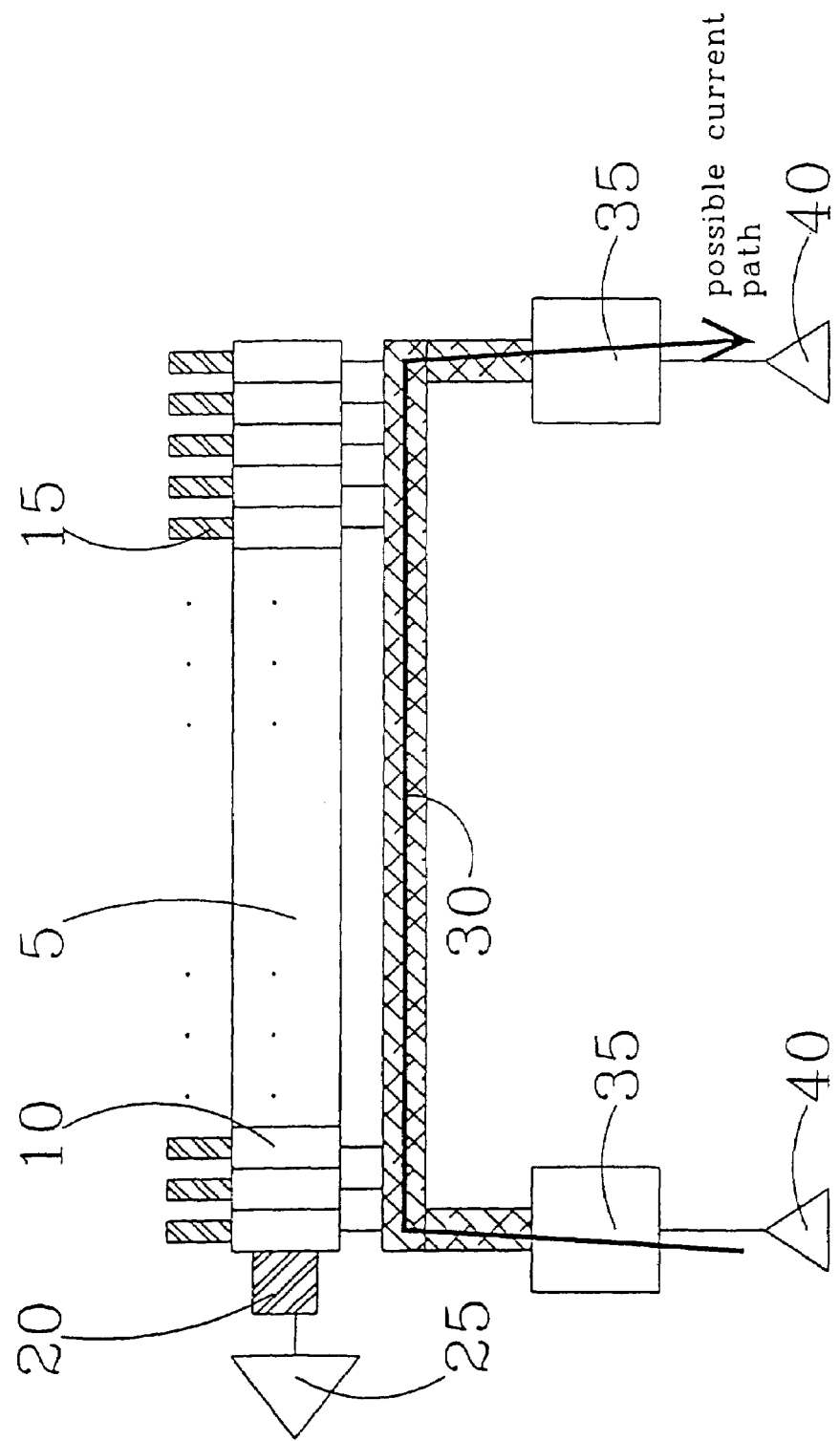

When the current drive required of clock driver 40 exceeds that which can be provided, known solutions add multiple clock drivers in parallel. IN FIG. 3, two clock drivers 40 are connected in parallel to one bond pad 35 and from there to one metal bus line 30. In FIG. 4, a single phase metal bus line 30 has two bond pads 35 connected at each end and two clock drivers 40, the outputs of which are connected to respective bond pads 35. The low impedance path from the output of one clock driver to the output of nearby clock drivers results in the first clock driver sourcing current into the low impedance outputs of the adjacent clock driver when there is any skew in the propagation delays through the clock drivers. This could possibly damage the clock drivers, create performance anomalies such as pixel non-uniformity or at least contribute to heating of the clock drivers.

Figure 5:
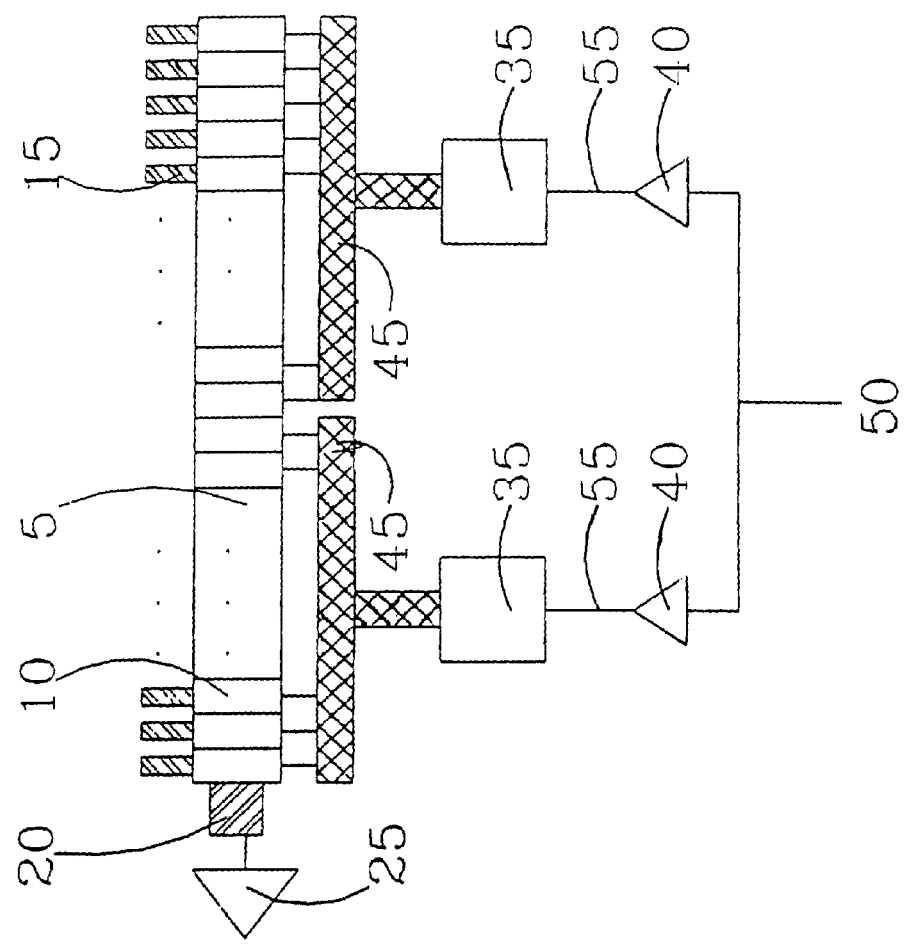
FIGS. 5, 6 and 7 are schematics diagrams of clocking structures according to the present invention.
Figure 6:
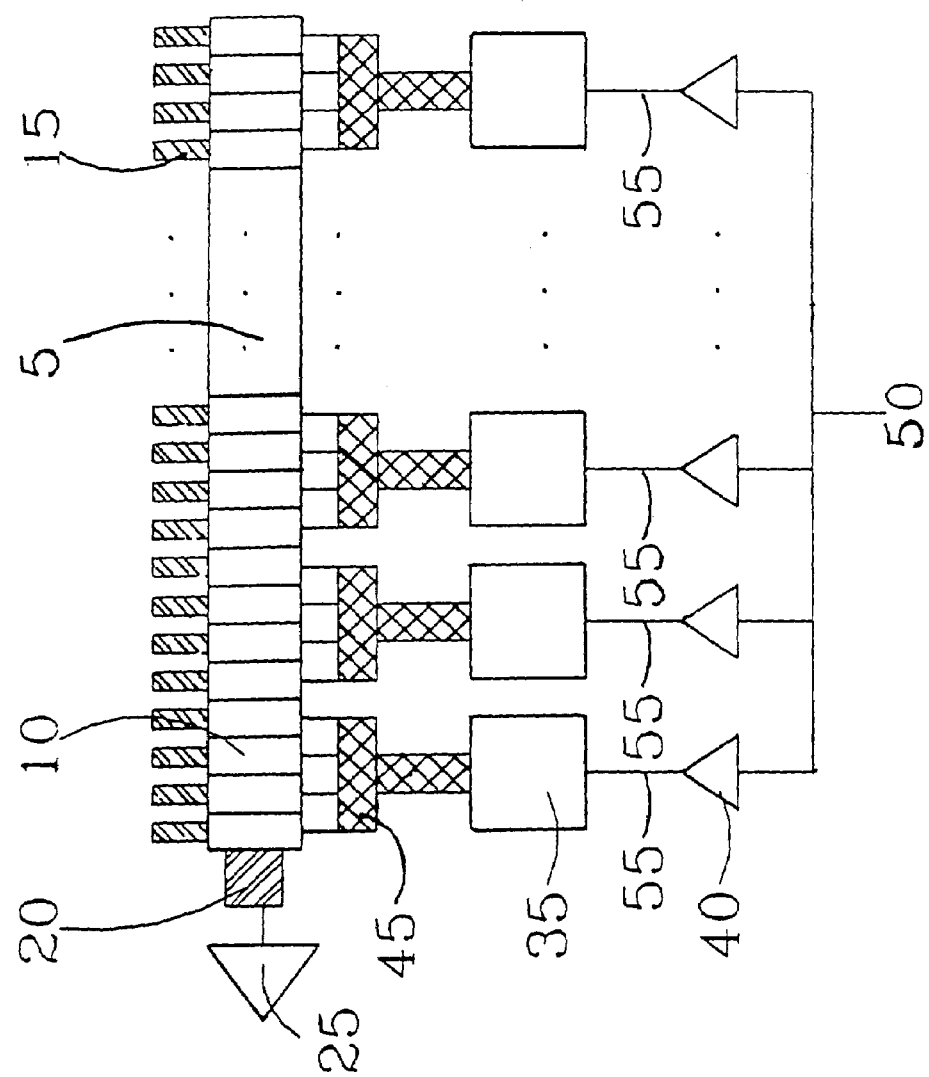
Figure 7:
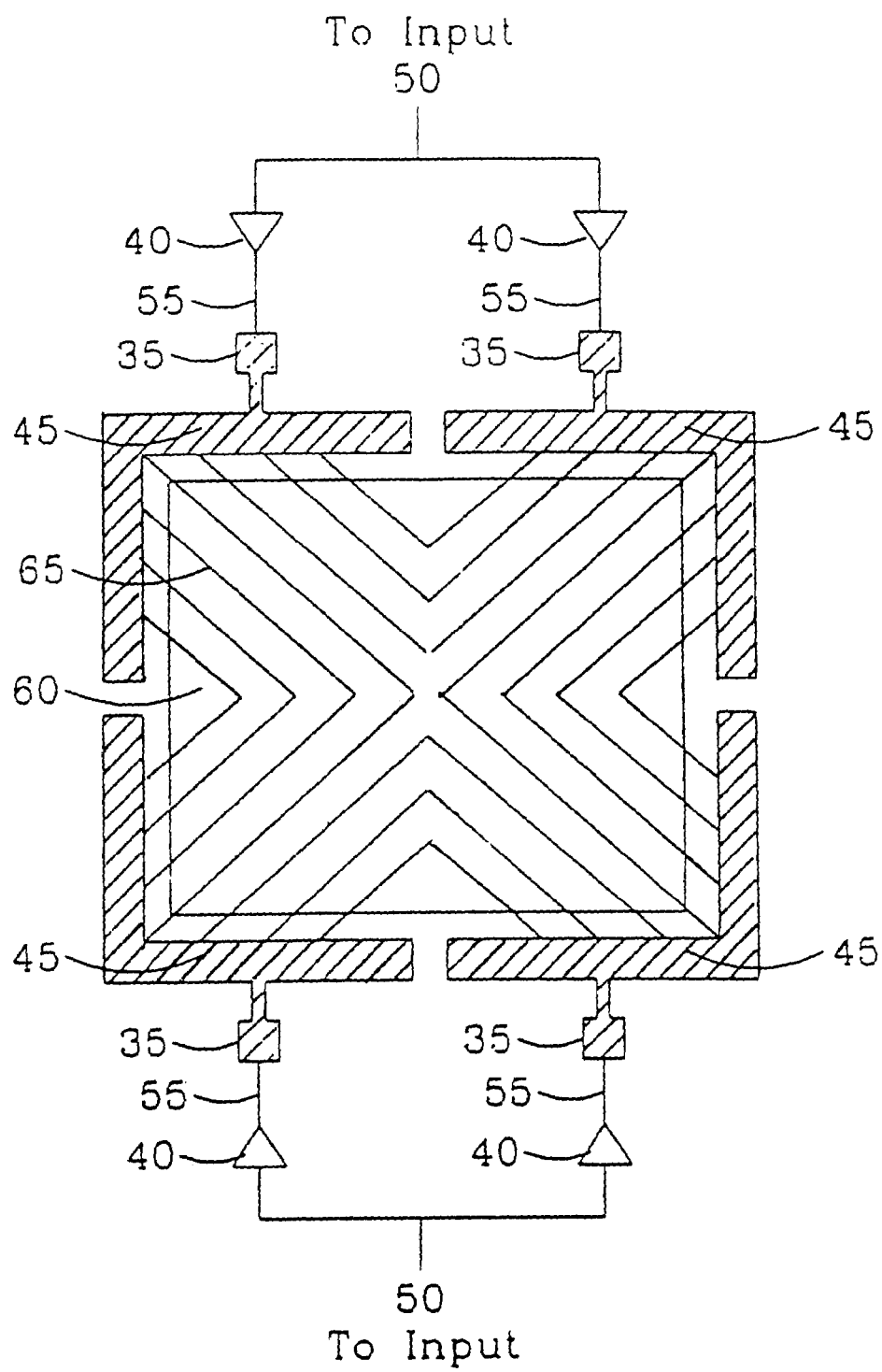

Embodiments of the invention are shown in FIGS. 5–7. As depicted, the embodiments generally comprise a circuit that includes a circuit chip and a plurality of clock drivers external to the circuit chip. The circuit chip includes a plurality of isolated clocking subunits and a corresponding plurality of respectively connected terminals (i.e., bond pads) where each clocking subunit is electrically isolated from any other clocking subunit and coupled to a respective terminal. Each clock driver includes a respective input and output where the inputs of all clock drivers are coupled together and the output of each clock driver is coupled to a respective terminal.

In FIG. 5, a circuit includes horizontal CCD 5 and horizontal CCD 5 includes plural CCD stages 10 that receive charge from pixels 15 and then clock the charge to output structure 20 and buffer 25. Horizontal CCD 5 preferably, but not necessarily, includes a channel overlaid by plural poly electrodes 12. Each CCD stage 10 includes a small grouping of poly electrodes 12, each electrode in a group corresponding to a unique clock phase.

In FIG. 5, a clock distribution bus includes plural metal bus segments 45 separated by electrically isolating gaps, each segment being connected to its own bond pad 35. Each bus segment 45 corresponds to an isolated clocking subunit. The poly electrodes 12 in a clocking subunit corresponding to a bus segment 45 are electrically independent from poly electrodes 12 in a clocking subunit corresponding any other bus segment 45 even for the same clock phase. There is no electrical connection across segments 45 by metal busses 30 as in the known circuit shown in FIG. 4.

Each bus segment 45, and therefore each corresponding clocking subunit, has its own external clock driver 40. Each clock driver 40 has an output 55 coupled to a respective bond pad 35. Each clock driver 40 has an input, and the input of all of the clock drivers 40 for a signal phase are coupled together and to circuit phase input 50. Each clock driver 40 then drives only a subset of the total capacitance. The absence of connectivity across segments 45 lacks a low impedance path from the output 55 of a driver 40 into an adjacent or other driver 40. This avoids cross-over current issues.

FIG. 6 illustrates a more general arrangement according to the same principles as described above. As in FIG. 5, each bus segment 45 corresponds to an isolated clocking subunit where the absence of the connectivity across bus segments 45 does not provide any low impedance path from the output 55 of a clock driver 40 into the output 55 of an adjacent or other clock driver 40.

The arrangements shown in FIGS. 5 and 6 are for the horizontal readout CCDs present with linear or area arrays. However, the same principals can also be applied for the imaging area of an area array or a time-delay and integration ("TDI") array; or also for the vertical CCDs ("VCCDs") in interline transfer sensors (ILT sensors). According to the present invention, there are advantages to providing one and only one driver for each clocking subunit. These advantages includes the elimination of cross over current that might occur when first and second drivers (or more drivers) have their outputs connected. The cross over current contributes to heating of the driver and delays the clock pulse to the clock line. In area arrays, the electrodes may even be metal strapped. In any event, the electrodes are partitioned up into plural subunits such that the CCD electrodes and metal bussing of a single subunit, including diagonal bussing within the array if any, are electrically independent of each other subunit, and each subunit has its own bond pad.

In general, a circuit includes a circuit chip and a plurality of clock drivers external to the circuit chip. The circuit chip includes a plurality of isolated clocking subunits and a corresponding plurality of terminals. Each clocking subunit is electrically isolated from any other clocking subunit. Each clocking subunit is coupled to a respective terminal. For each of the plurality of terminals, an output from one and only one clock driver of the plurality of clock drivers is coupled to the corresponding terminal of the plurality of terminals; however, inputs of all clock drivers are coupled together.

In a variant of the above general circuit description, the circuit chip may be either a CCD sensor (i.e., charge coupled device sensor) or a CMOS sensor (i.e., complimentary MOS transistor sensor), but is preferably a CCD sensor.

In an alternative variant of the above general circuit description, the circuit chip may be any chip with a CCD readout register, and the CCD readout register includes the plurality of isolated clocking subunits.

In another alternative variant of the above general circuit description, the circuit chip is an ILT CCD sensor (i.e., an interline transfer CCD sensor) that includes a vertical CCD register, and the vertical CCD register includes the plurality of isolated clocking subunits.

In another alternative variant of the above general circuit description, each clocking subunit includes polysilicon electrodes, and the polysilicon electrodes of a first clocking subunit are electrically coupled to each other and are electrically isolated from all electrodes in other clocking subunits. The terminal corresponding to the first clocking subunit connects to the polysilicon electrodes of the first clocking subunit. Another alternative variant of the above general circuit description, the circuit chip is a metal strapped TDI sensor (e.g., time delay and integrate type sensor). Diagonal metal strapping is suitable for TDI sensors since the array of pixels are operated to integrate charge in columns so that the metal strapping will not create shadows (they are averaged out). For example, see U.S. Pat. No. 4,375,652 to White, incorporated herein by reference. The metal strapped TDI sensor includes an imaging area that is partitioned into a plurality of imaging sections. The metal strapped TDI sensor also includes metal strapping that is partitioned into a plurality of metal strapping groups that correspond to the plurality of imaging sections. The metal strapped TDI sensor further includes a perimeter metal bus that is partitioned into a plurality of perimeter metal bus segments that correspond to the plurality of metal strapping groups. An imaging section, a corresponding metal strapping group and a corresponding perimeter metal bus segment collectively include a corresponding isolated clocking subunit of the plurality of isolated clocking subunits.

This is shown in FIG. 7, a CCD array 60 according to the same principles of the arrangements shown in FIGS. 5 and 6, includes diagonal bussing segments 65 within the area 60 of the area array. As discussed above, each bus segment 45 corresponds to an isolated clocking subunit where the absence of the connectivity across bus segments 45 or diagonal bussing segments 65 lacks any low impedance path from output 55 of a clock driver 40 into an output of an adjacent or other clock driver 40. The poly electrodes 12 (not shown in FIG. 7) in a clocking subunit corresponding to a bus segment 45 are electrically independent from poly electrodes 12 in a clocking subunit corresponding any other bus segment 45, lacking connections across segments 45 by metal busses 30 and lacking connections across segments 45 by poly connections.

What is claimed is:

1. A circuit comprising a circuit chip and a plurality of clock drivers external to the circuit chip, wherein:
   the circuit chip includes a plurality of isolated clocking subunits and a corresponding plurality of terminals;
   each clocking subunit is electrically isolated from any other clocking subunit;
   each clocking subunit is coupled to a respective terminal;
   for each of the plurality of terminals, an output from one and only one clock driver of the plurality of clock drivers is coupled to the corresponding terminal of the plurality of terminals; and
   inputs of all clock drivers are coupled together.

2. The circuit of claim 1, wherein the circuit chip is one of a CCD sensor and a CMOS sensor.

3. The circuit of claim 1, wherein the circuit chip is a CCD sensor.

4. The circuit of claim 1, wherein:
   the circuit chip includes a CCD readout register; and
   the CCD readout register includes the plurality of isolated clocking subunits.

5. The circuit of claim 1, wherein:
   the circuit chip is an area array sensor that includes a vertical CCD register; and
   the vertical CCD register includes the plurality of isolated clocking subunits.

6. The circuit of claim 1, wherein:
   the circuit chip is a metal strapped TDI sensor;
   the metal strapped TDI sensor includes an imaging area that is partitioned into a plurality of imaging sections;
   the metal strapped TDI sensor also includes metal strapping that is partitioned into a plurality of metal strapping groups that correspond to the plurality of imaging sections;
   the metal strapped TDI sensor further includes a perimeter metal bus that is partitioned into a plurality of perimeter metal bus segments that correspond to the plurality of metal strapping groups; and
   an imaging section, a corresponding metal strapping group and a corresponding perimeter metal bus segment collectively include a corresponding isolated clocking subunit of the plurality of isolated clocking subunits.

7. The circuit of claim 1, wherein:
   each clocking subunit includes polysilicon electrodes; and
   the polysilicon electrodes of a first clocking subunit are electrically coupled to each other and are electrically isolated from all electrodes in other clocking subunits.

8. The circuit of claim 7, wherein the terminal corresponding to the first clocking subunit connects to the polysilicon electrodes of the first clocking subunit.

9. The circuit of claim 1, wherein the terminals are bond pads.

10. The circuit of claim 1, wherein the circuit chip is a linescan sensor.

11. A circuit according to claim 1, wherein:
the circuit chip is an interline transfer sensor that includes at least one vertical CCD register; and
the at least one vertical CCD register includes the plurality of isolated clocking subunits.

12. A circuit according to claim 1, wherein the circuit chip is a TDI sensor.

13. A method comprising steps of:
providing a circuit chip that includes a plurality of terminals and a corresponding plurality of clocking subunits on the circuit chip so arranged that each clocking subunit is connected to a corresponding terminal, each clocking subunit being electrically isolated from any other clocking subunit;
assembling, with the circuit chip, a plurality of clock drivers external to the circuit chip;
for each of the plurality of terminals, coupling an output from one and only one clock driver of the plurality of clock drivers to the corresponding terminal of the plurality of terminals; and
coupling together an input from each of the clock drivers.

14. The method of claim 13, wherein the step of providing includes providing one of a CCD sensor and a CMOS sensor.

15. The method of claim 13, wherein the step of providing includes providing a CCD sensor.

16. The method of claim 13, wherein the step of providing includes providing a metal strapped TDI CCD sensor that includes:
an imaging area that is partitioned into a plurality of imaging sections;
metal strapping that is partitioned into a plurality of metal strapping groups that correspond to the plurality of imaging sections; and
a perimeter metal bus that is partitioned into a plurality of perimeter metal bus segments that correspond to the plurality of metal strapping groups,
wherein an imaging section, a corresponding metal strapping group and a corresponding perimeter metal bus segment collectively include a corresponding isolated clocking subunit of the plurality of isolated clocking subunits.

17. The method of claim 13, wherein the step of providing includes providing a CCD sensor that includes a CCD readout register, the CCD readout register including the plurality of isolated clocking subunits.

18. The method of claim 13, wherein the step of providing includes providing an area array sensor that includes a vertical CCD register, the vertical CCD register including the plurality of isolated clocking subunits.

19. The method of claim 13, wherein the step of providing includes providing a linescan sensor.

20. A circuit comprising a circuit chip and a plurality of clock drivers external to the circuit chip, wherein:
the circuit chip includes a plurality of isolated clocking subunits and a corresponding plurality of terminals;
each clocking subunit is electrically isolated from any other clocking subunit;
each clocking subunit is coupled to a respective terminal;
for each of the plurality of terminals, an output from one and only one clock driver of the plurality of clock drivers is coupled to the corresponding terminal of the plurality of terminals; and
inputs of all of the plurality of clock drivers are short-circuited together.

21. The circuit of claim 20, wherein:
the circuit chip includes a CCD readout register; and
the CCD readout register includes the plurality of isolated clocking subunits.

22. A circuit according to claim 20, wherein:
the circuit chip is an interline transfer sensor that includes at least one vertical CCD register; and
the at least one vertical CCD register includes the plurality of isolated clocking subunits.

23. A circuit according to claim 20, wherein the circuit chip is a TDI sensor.

24. A circuit comprising a circuit chip and a plurality of clock drivers external to the circuit chip, wherein:
the circuit chip includes a plurality of isolated clocking subunits and a corresponding plurality of terminals;
each clocking subunit is electrically isolated from any other clocking subunit;
each clocking subunit is coupled to a respective terminal;
for each of the plurality of terminals, an output from one and only one clock driver of the plurality of clock drivers is coupled to the corresponding terminal of the plurality of terminals; and
inputs of all of the plurality of clock drivers are coupled to a single clock phase signal.

25. The circuit of claim 24, wherein:
the circuit chip includes a CCD readout register; and
the CCD readout register includes the plurality of isolated clocking subunits.

26. A circuit according to claim 24, wherein:
the circuit chip is an interline transfer sensor that includes at least one vertical CCD register; and
the at least one vertical CCD register includes the plurality of isolated clocking subunits.

27. A circuit according to claim 24, wherein the circuit chip is a TDI sensor.

28. A circuit comprising a circuit chip and a plurality of clock drivers external to the circuit chip, wherein:
the circuit chip includes a metal strapped TDI sensor and a plurality of terminals;
the metal strapped TDI sensor includes an imaging area that is partitioned into a plurality of imaging sections, metal strapping that is partitioned into a plurality of metal strapping groups that correspond to the plurality of imaging sections, and a perimeter metal bus that is partitioned into a plurality of perimeter metal bus segments that correspond to the plurality of metal strapping groups;
the plurality of imaging sections, the plurality of metal strapping groups and the plurality of perimeter metal bus segments are arranged into a plurality of isolated clocking subunits such that each isolated clocking subunit includes an imaging section of the plurality of imaging sections, a corresponding metal strapping group of the plurality of metal strapping groups and a corresponding perimeter metal bus segment of the plurality of perimeter metal bus segments;
each clocking subunit is electrically isolated from any other clocking subunit;
each clocking subunit is coupled to a respective terminal;
for each of the plurality of terminals, an output from one and only one clock driver of the plurality of clock drivers is coupled to the corresponding terminal of the plurality of terminals; and
inputs of all of the plurality of clock drivers are coupled together.

29. A method comprising:

providing a circuit chip that includes a metal strapped TDI CCD sensor and a plurality of terminals, wherein the metal strapped TDI CCD sensor includes an imaging area that is partitioned into a plurality of imaging sections, metal strapping that is partitioned into a plurality of metal strapping groups that correspond to the plurality of imaging sections, and a perimeter metal bus that is partitioned into a plurality of perimeter metal bus segments that correspond to the plurality of metal strapping groups, and wherein the plurality of imaging sections, the plurality of metal strapping groups and the plurality of perimeter metal bus segments are arranged into a plurality of isolated clocking subunits such that each isolated clocking subunit includes an imaging section of the plurality of imaging sections, a corresponding metal strapping group of the plurality of metal strapping groups and a corresponding perimeter metal bus segment of the plurality of perimeter metal bus segments, and wherein each isolated clocking subunit is connected to a respective terminal of the plurality of terminals, each isolated clocking subunit being electrically isolated from any other isolated clocking subunit;

assembling, with the circuit chip, a plurality of clock drivers external to the circuit chip;

for each of the plurality of terminals, coupling an output from one and only one clock driver of the plurality of clock drivers to the corresponding terminal of the plurality of terminals; and coupling together an input from each of the clock drivers.

\* \* \* \* \*